(12) United States Patent
Jennings et al.

(10) Patent No.: US 9,245,886 B2
(45) Date of Patent: Jan. 26, 2016

(54) SWITCH SUPPORTING VOLTAGES GREATER THAN SUPPLY

(71) Applicant: Xilinx, Inc., San Jose, CA (US)

(72) Inventors: John K. Jennings, Dublin (IE); Ionut C. Cical, Dublin (IE)

(73) Assignee: XILINX, INC., San Jose, CA (US)

(*) Notice: Subject to any disclaimer, the term of this patent is extended or adjusted under 35 U.S.C. 154(b) by 173 days.

(21) Appl. No.: 13/941,419

(22) Filed: Jul. 12, 2013

(65) Prior Publication Data

US 2015/0014779 A1    Jan. 15, 2015

(51) Int. Cl.

| | |
|---|---|
| H01L 21/70 | (2006.01) |
| H01L 27/092 | (2006.01) |
| H01L 29/78 | (2006.01) |
| H03K 17/06 | (2006.01) |
| H03K 17/0812 | (2006.01) |
| H03K 17/693 | (2006.01) |

(52) U.S. Cl.
CPC .............. *H01L 27/092* (2013.01); *H01L 29/78* (2013.01); *H03K 17/06* (2013.01); *H03K 17/08122* (2013.01); *H03K 17/693* (2013.01); *H03K 2017/066* (2013.01); *H03K 2217/0054* (2013.01)

(58) Field of Classification Search
CPC ....... H01L 29/78; H03K 17/06; H03K 17/693
USPC ........................................... 257/369
See application file for complete search history.

(56) References Cited

U.S. PATENT DOCUMENTS

| | | | |
|---|---|---|---|
| 8,519,771 B1 * | 8/2013 | Cical et al. ..................... | 327/427 |
| 2011/0156794 A1 | 6/2011 | Guo | |

* cited by examiner

*Primary Examiner* — Douglas Menz
(74) *Attorney, Agent, or Firm* — Kin-Wah Tong

(57) ABSTRACT

Devices for isolating an input from an output are disclosed. For example, a device includes a first p-type metal oxide semiconductor transistor and a first circuit. A source of the first p-type metal oxide semiconductor transistor is connected to an input of the device. The first circuit is for delivering a signal on the input of the device to a gate of the first p-type metal oxide semiconductor transistor when an enable signal is deactivated and for delivering a ground voltage to the gate of the first p-type metal oxide semiconductor transistor when the enable signal is activated.

12 Claims, 2 Drawing Sheets

SWITCH SUPPORTING VOLTAGES GREATER THAN SUPPLY

FIELD OF THE INVENTION

The disclosure relates generally to integrated circuits and relates more particularly to a switch that prevents off current flow between terminals.

BACKGROUND OF THE INVENTION

A typical complementary metal oxide semiconductor (CMOS) switch uses a p-type metal oxide semiconductor (PMOS) transistor and an n-type metal oxide semiconductor (NMOS) transistor to sample voltages that are received at an input. As an example, a PMOS transistor and an NMOS transistor are connected in parallel and share a common input and a common output. The gates of the PMOS transistor and the NMOS transistor are controlled by complementary signals for enabling the transistors, and when enabled, the switch allows the input to pass to the output. Thus, the output is the voltage sample on the input during the time in which the enable signals allow the transistors to be closed.

In addition, several switches may be connected in parallel, essentially comprising a multiplexer. For example, such a multiplexer may be used to sample voltages from several different points throughout a circuit. As an example, this arrangement may be used for an analog bus to monitor voltages around an integrated circuit chip and to send the sampled voltages to a voltage monitor. This arrangement works well for normal operation. Yet in many cases, the purpose of monitoring voltages through a circuit is to detect abnormal or undesirable voltage events. However, conventional devices may not be able to perform measurement functions for voltages outside of an expected range.

SUMMARY OF THE INVENTION

The present disclosure provides a device that includes a first p-type metal oxide semiconductor transistor and a first circuit. A source of the first p-type metal oxide semiconductor transistor is connected to an input of the device. The first circuit is for delivering a signal on the input of the device to a gate of the first p-type metal oxide semiconductor transistor when an enable signal is deactivated and for delivering a ground voltage to the gate of the first p-type metal oxide semiconductor transistor when the enable signal is activated.

In various examples: the source of the first p-type metal oxide semiconductor transistor is shorted to a bulk of the first p-type metal oxide semiconductor transistor; the first circuit comprises a second p-type metal oxide semiconductor transistor, wherein a source of the second p-type metal oxide semiconductor transistor is connected to the input of the device and wherein a gate of the second p-type metal oxide semiconductor transistor is connected to an enable signal, a first n-type metal oxide semiconductor transistor, wherein a source of the first n-type metal oxide semiconductor transistor is connected to ground, wherein a drain of the first n-type metal oxide semiconductor transistor is connected to a drain of the second p-type metal oxide semiconductor transistor, wherein a gate of the first n-type metal oxide semiconductor transistor is connected to the enable signal, and a second n-type metal oxide semiconductor transistor, wherein a gate of the second n-type metal oxide semiconductor transistor is connected to an inversion of the enable signal, wherein a source of the second n-type metal oxide semiconductor transistor is connected to the input of the device, and wherein the drain of the second p-type metal oxide semiconductor transistor, the drain of the first n-type metal oxide semiconductor transistor, and a drain of the second n-type metal oxide semiconductor transistor are connected to the gate of the first p-type metal oxide semiconductor transistor; the inversion of the enable signal and ground are a same voltage; the device further comprises a third p-type metal oxide semiconductor transistor, wherein a source of the third p-type metal oxide semiconductor transistor is connected to an output of the device, and wherein a drain of the third p-type metal oxide semiconductor transistor is connected to a drain of the first p-type metal oxide semiconductor transistor and a second circuit, for delivering a signal on the output of the device to a gate of the third p-type metal oxide semiconductor transistor when the enable signal is deactivated and for delivering the ground voltage to a gate of the third p-type metal oxide semiconductor transistor when the enable signal is activated; the second circuit comprises a fourth p-type metal oxide semiconductor transistor, wherein a source of the fourth p-type metal oxide semiconductor transistor is connected to the output of the device and wherein a gate of the fourth p-type metal oxide semiconductor transistor is connected to the enable signal, a third n-type metal oxide semiconductor transistor, wherein a source of the third n-type metal oxide semiconductor transistor is connected to ground and wherein a gate of the third n-type metal oxide semiconductor transistor is connected to the enable signal and a fourth n-type metal oxide semiconductor transistor, wherein a gate of the fourth n-type metal oxide semiconductor transistor is connected to the inversion of the enable signal, wherein a source of the fourth n-type metal oxide semiconductor transistor is connected to the output of the device, and wherein a drain of the fourth p-type metal oxide semiconductor transistor, a drain of the third n-type metal oxide semiconductor transistor, and a drain of the fourth n-type metal oxide semiconductor transistor are connected to the gate of the third p-type metal oxide semiconductor transistor; the device further comprises a fifth n-type metal oxide semiconductor transistor, wherein a source of the fifth n-type metal oxide semiconductor transistor is connected to the input of the device and a third circuit, for delivering a signal on the input of the device to a gate of the fifth n-type metal oxide semiconductor transistor when an enable signal is deactivated and for delivering a supply voltage to the gate of the fifth n-type metal oxide semiconductor transistor when the enable signal is activated; the enable signal is a same voltage as the supply voltage; the input of the device comprises an analog signal having a voltage between a voltage level of ground and a voltage level of the supply voltage; the third circuit comprises a sixth n-type metal oxide semiconductor transistor, wherein a source of the sixth n-type metal oxide semiconductor transistor is connected to the input of the device and wherein a gate of the sixth n-type metal oxide semiconductor transistor is connected to the inversion of the enable signal, a fifth p-type metal oxide semiconductor transistor, wherein a source of the fifth p-type metal oxide semiconductor transistor is connected to the supply voltage and wherein a gate of the fifth p-type metal oxide semiconductor transistor is connected to the inversion of the enable signal and a sixth p-type metal oxide semiconductor transistor, wherein a source of the sixth p-type metal oxide semiconductor transistor is connected to the input signal, wherein a gate of the sixth p-type metal oxide semiconductor transistor is connected to the enable signal, and wherein a drain of the sixth n-type metal oxide semiconductor transistor, a drain of the fifth p-type metal oxide semiconductor transistor and a drain of the sixth p-type metal oxide semiconductor transistor are connected to a gate of the fifth n-type metal oxide semiconductor transistor; the device further comprises a seventh n-type metal oxide semiconductor transistor, wherein a source of the seventh n-type metal oxide semiconductor transistor is connected to an output of the device and wherein a drain of the seventh n-type metal oxide semiconductor transistor is connected to a drain of the fifth n-type metal oxide semiconductor transistor and a fourth circuit, for delivering a signal on the output of the device to a gate of the seventh n-type metal oxide semiconductor transistor when an enable signal is deactivated and for delivering a supply voltage to the gate of the seventh n-type metal oxide semiconductor transistor when the enable signal is activated; the fourth circuit comprises a seventh p-type metal oxide semiconductor transistor, wherein a source of the seventh p-type metal oxide semiconductor transistor is connected to the supply voltage and wherein a gate of the seventh p-type metal oxide semiconductor transistor is connected to the inversion of the enable signal, an eighth n-type metal oxide semiconductor transistor, wherein a source of the eighth n-type metal oxide semiconductor transistor is connected to the output of the device and wherein a gate of the eighth n-type metal oxide semiconductor transistor is connected to the inversion of the enable signal, and an eighth p-type metal oxide semiconductor transistor, wherein a source of the eighth p-type metal oxide semiconductor transistor is connected to the output of the device, wherein a gate of the eighth p-type metal oxide semiconductor transistor is connected to the enable signal, wherein a drain of the seventh p-type metal oxide semiconductor transistor, a drain of the eighth p-type metal oxide semiconductor transistor and a drain of the eighth n-type metal oxide semiconductor transistor are connected to a gate of the seventh n-type metal oxide semiconductor transistor; and the device further comprises a third p-type metal oxide semiconductor transistor, wherein a source of the third p-type metal oxide semiconductor transistor is connected to an output of the device, and wherein a drain of the third p-type metal oxide semiconductor transistor is connected to a drain of the first p-type metal oxide semiconductor transistor and a second circuit, for delivering the signal on the output of the device to a gate of the third p-type metal oxide semiconductor transistor when the enable signal is deactivated and for delivering the ground voltage to a gate of the third p-type metal oxide semiconductor transistor when the enable signal is activated.

The present disclosure also provides a device having a first n-type metal oxide semiconductor transistor and a first circuit. A source of the first n-type metal oxide semiconductor transistor is connected to an input of the device. The first circuit is for delivering a signal on the input of the device to a gate of the first n-type metal oxide semiconductor transistor when an enable signal is deactivated and for delivering a supply voltage to the gate of the first p-type metal oxide semiconductor transistor when the enable signal is activated.

In various examples: the first circuit comprises a second n-type metal oxide semiconductor transistor, wherein a source of the second n-type metal oxide semiconductor transistor is connected to the input of the device and wherein a gate of the second n-type metal oxide semiconductor transistor is connected to an inversion of the enable signal, a first p-type metal oxide semiconductor transistor, wherein a source of the first p-type metal oxide semiconductor transistor is connected to the supply voltage, wherein a drain of the first p-type metal oxide semiconductor transistor is connected to a drain of the second n-type metal oxide semiconductor transistor, wherein a gate of the first p-type metal oxide semiconductor transistor is connected to the inversion of the enable signal, and a second p-type metal oxide semiconductor transistor, wherein a gate of the second p-type metal oxide semiconductor transistor is connected to the enable signal, wherein a source of the second p-type metal oxide semiconductor transistor is connected to the input of the device, and wherein the drain of the second n-type metal oxide semiconductor transistor, the drain of the first p-type metal oxide semiconductor transistor, and a drain of the second p-type metal oxide semiconductor transistor are connected to the gate of the first n-type metal oxide semiconductor transistor; and the device further comprises a third n-type metal oxide semiconductor transistor, wherein a source of the third n-type metal oxide semiconductor transistor is connected to an output of the device, and wherein a drain of the third n-type metal oxide semiconductor transistor is connected to a drain of the first n-type metal oxide semiconductor transistor and a second circuit, for delivering a signal on the output of the device to a gate of the third n-type metal oxide semiconductor transistor when the enable signal is deactivated and for delivering the supply voltage to a gate of the third n-type metal oxide semiconductor transistor when the enable signal is activated.

The present disclosure further provides a device having a first p-type metal oxide semiconductor transistor and a first circuit. A source of the third p-type metal oxide semiconductor transistor is connected to an output of the device. The first circuit is for delivering a signal on the output of the device to a gate of the first p-type metal oxide semiconductor transistor when an enable signal is deactivated and for delivering a ground voltage to a gate of the first p-type metal oxide semiconductor transistor when the enable signal is activated.

In various examples: the first circuit comprises a second p-type metal oxide semiconductor transistor, wherein a source of the second p-type metal oxide semiconductor transistor is connected to the output of the device and wherein a gate of the second p-type metal oxide semiconductor transistor is connected to the enable signal and a first n-type metal oxide semiconductor transistor, wherein a source of the first n-type metal oxide semiconductor transistor is connected to ground and wherein a gate of the first n-type metal oxide semiconductor transistor is connected to the enable signal and a second n-type metal oxide semiconductor transistor, wherein a gate of the second n-type metal oxide semiconductor transistor is connected to an inversion of the enable signal, wherein a source of the second n-type metal oxide semiconductor transistor is connected to the output of the device, and wherein a drain of the second p-type metal oxide semiconductor transistor, a drain of the first n-type metal oxide semiconductor transistor, and a drain of the second n-type metal oxide semiconductor transistor are connected to the gate of the first p-type metal oxide semiconductor transistor; and the device further comprises a third n-type metal oxide semiconductor transistor, wherein a source of the third n-type metal oxide semiconductor transistor is connected to the output of the device and a second circuit, for delivering a signal on the output of the device to a gate of the third n-type metal oxide semiconductor transistor when an enable signal is deactivated and for delivering a supply voltage to the gate of the third n-type metal oxide semiconductor transistor when the enable signal is activated.

The present disclosure additionally provides a device having an n-type metal oxide semiconductor transistor and a circuit. A source of the n-type metal oxide semiconductor transistor is connected to an output of the device. The circuit is for delivering a signal on the output of the device to a gate of the n-type metal oxide semiconductor transistor when an enable signal is deactivated and for delivering a supply voltage to the gate of the n-type metal oxide semiconductor transistor when the enable signal is activated.

The present disclosure also provides a method for controlling a p-type metal oxide semiconductor transistor. For example, the method includes forwarding an input signal to a source of the p-type metal oxide semiconductor transistor and receiving an enable signal. The enable signal comprises one of a ground voltage or a supply voltage. The method also includes transmitting the ground voltage to a gate of the p-type metal oxide semiconductor transistor when the enable signal is the supply voltage, where the p-type metal oxide semiconductor transistor is closed when the ground voltage is transmitted to the gate of the p-type metal oxide semiconductor transistor. The method further includes, transmitting the input signal to the gate of the p-type metal oxide semiconductor transistor when the enable signal is the ground voltage, where the p-type metal oxide semiconductor transistor is open when the input signal is transmitted to the gate of the p-type metal oxide semiconductor transistor.

The present disclosure further provides a method for isolating an input signal to a circuit. For example, the method includes receiving the input signal, where the input signal exceeds a supply voltage of the circuit, forwarding the input signal to a source of a first p-type metal oxide semiconductor transistor of the circuit and forwarding the input signal to a source of a second p-type metal oxide semiconductor transistor of the circuit. The method next forwards a ground voltage to the gate of the second p-type metal oxide semiconductor transistor, where the second p-type metal oxide semiconductor transistor is closed when the ground voltage is forwarded to the gate of the second p-type metal oxide semiconductor transistor and where the input signal passes from the source of the second p-type metal oxide semiconductor transistor to a drain of the second p-type metal oxide semiconductor transistor. The method then forwards the input signal from the drain of the second p-type metal oxide semiconductor transistor to a gate of the first p-type metal oxide semiconductor transistor, where the first p-type metal oxide semiconductor is open when the input signal is forwarded to the gate of the first p-type metal oxide semiconductor and forwarded to the source of the first p-type metal oxide semiconductor.

It should be noted that although the terms, "first," "second," "third," etc., have been used above, the use of these terms are intended as labels only. Thus, the use of a term such as "third" in one example does not necessarily imply that the example must in every case include a "first" and/or a "second".

BRIEF DESCRIPTION OF THE DRAWINGS

The accompanying drawing show exemplary circuit in accordance with one or more aspects of the disclosure; however, the accompanying drawing should not be taken to limit the disclosure to the example shown, but is for explanation and understanding only.

To facilitate understanding, identical reference numerals have been used, where possible, to designate identical elements that are common to the figures.

DETAILED DESCRIPTION OF THE DRAWINGS

The present disclosure relates generally to devices that prevent the flow of current between different terminals of a multiplexer. For example, a multiplexer may be used to measure or sample voltages through a device or circuit. In addition, in one example, each of the input terminals of the multiplexer is connected to a different part of the device where a voltage is to be measured. The input terminals have respective paths which are then connected to a common output terminal. In one example, each path comprises a complementary metal oxide semiconductor (CMOS) switch that, when on, allows the flow of current from the input terminal to the output terminal, and when off, prevents the flow of current from the input terminal to the output terminal. To measure the voltage in one location on the device, the path having the input terminal connected to that location is turned on; e.g., the corresponding CMOS switch is turned on. Each of the other paths is turned off. In this way, the output may supply a measurement or sampling circuit that is able to successively and/or periodically measure/sample the different voltages that may be present at different locations within the device. However, when the source or drain of a PMOS transistor or an NMOS transistor exceeds the gate voltage, the gate may close or turn the transistor on. Thus, if the common output of the multiplexer is a voltage that exceeds the supply voltage (and thus the gate voltage), it can cause transistors on the CMOS gates of the other inputs to be closed, allowing current to flow between the source and the drain, whereas the transistors are supposed to be open, preventing the flow of current.

Figure 1:
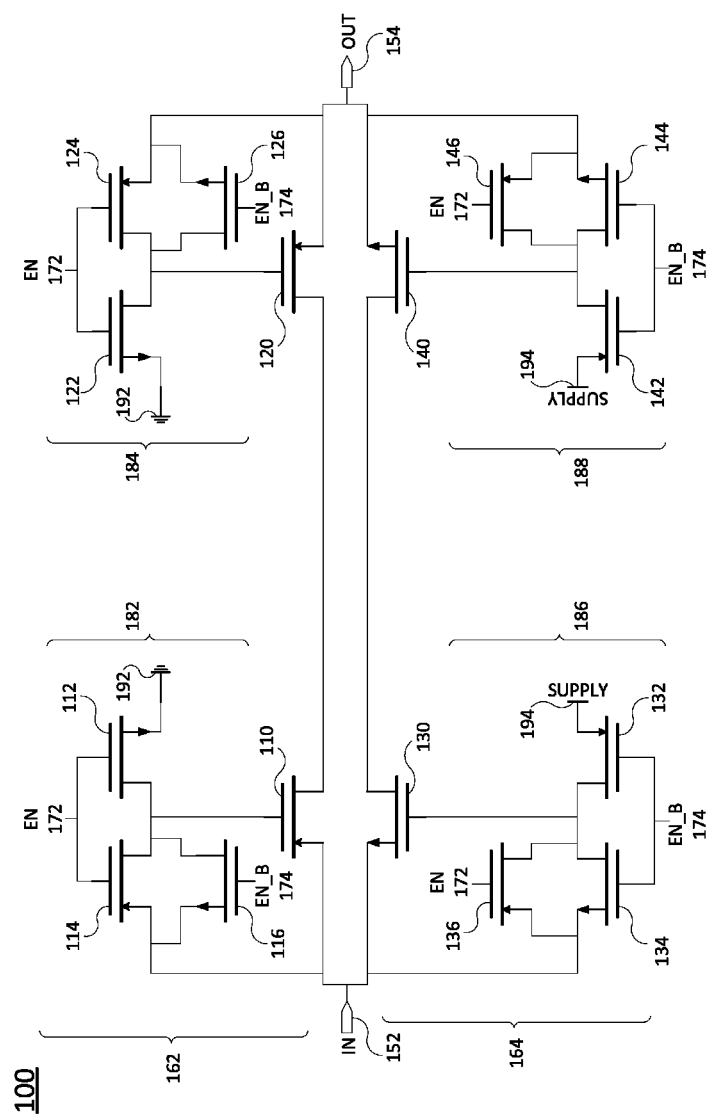
FIG. 1 illustrates a block diagram of a first device.

To better understand the present disclosure, FIG. 1 illustrates a high level block diagram of a device 100. Notably, device 100 overcomes the shortcomings of the abovementioned CMOS switch. More specifically, device 100, which may also be considered a CMOS switch, isolates the input signal from the output signal and retains this capability even where the input and/or the output voltage exceeds the supply voltage or the ground voltage. Device 100 includes two paths, a PMOS path 162 and an NMOS path 164 which correspond to the PMOS and NMOS devices respectively in a conventional CMOS switch.

It should be noted that in FIG. 1, each of the PMOS and NMOS transistors is shown using the notation where the arrow indicates the direction of the PN junction involving the source terminal, e.g., from the p-type region to the n-type region. Thus, in a PMOS transistor, the arrow indicates the PN junction is from the p-type source terminal to the n-type substrate. Conversely, the arrow in an NMOS transistor indicates the PN junction from the p-type substrate to the n-type source terminal. The drain is indicated in each transistor as the terminal that does not have an arrow. In one example, the transistors have the source terminals connected to and/or shorted to the substrate or bulk terminal. In another example, one or more of the PMOS transistors have their bulk terminals connected to the supply voltage and one or more of the NMOS transistors have their bulk terminals connected to ground. For example, all of the PMOS and NMOS transistors can have their bulk terminals connected in this way; however, in one instance PMOS transistors 110 and 120 and NMOS transistors 130 and 140 may still have their source terminals shorted with the respective bulk terminals. For illustrative purposes, unless otherwise indicated the source terminal of each transistor (indicated by an arrow) is shorted to the respective bulk terminal.

The PMOS path 162 includes PMOS transistor 110 which has its source terminal connected to an input terminal 152 of the device 100. The PMOS path 162 also includes NMOS transistor 112, PMOS transistor 114 and NMOS transistor 116. Collectively, the transistors 112, 114 and 116 may comprise a circuit 182 that delivers a signal on the input terminal 152 to the gate of the PMOS transistor 110 when the enable signal 172 is low and that delivers a ground signal 192 when the enable signal 172 is high. In one example, the enable signal 172 is considered high when it is at a voltage level that is the same as the supply voltage of the device 100. Similarly, the enable signal 172 is considered to be low when it is at ground, e.g., a zero voltage level, or a voltage level that is the lowest voltage level utilized in the device 100. Henceforth, for illustrative purposes it will be assumed that the ground voltage level is zero volts and that other voltage levels are in reference to the ground voltage level being 0 V (zero volts). In one example, the supply voltage may be 1.8 V. Thus, the supply voltage is 1.8 V greater than the ground. In addition, in one example, the input and output signals may comprise analog signals that are expected to typically be between zero and approximately 1.8 volts.

Notably, the circuit 182 may be controlled by the enable signal 172. For example, by setting the enable signal low, e.g., zero volts, the input signal can be selected for transmission to the gate of PMOS transistor 110. By setting the enable signal high, e.g., 1.8 V, the ground signal 192 is transmitted to the gate of PMOS transistor 110. To illustrate, if the enable signal is zero volts and the input signal is 1.2 V, the input signal of 1.2 V will be present at the source terminals of PMOS transistor 114 and NMOS transistor 116. The gate of PMOS transistor 114 is connected to the enable signal 172, which is zero volts. For a PMOS transistor to close, or to turn on, the voltage between the gate and the source, Vgs, must be negative. It must also be greater in magnitude than the threshold voltage for the transistor. However, this condition is assumed to be satisfied for purposes of illustration with respect to the present disclosure.

In this case, for PMOS transistor 114, Vgs=0 V−1.2 V=−1.2 V. Since this is negative, the gate is closed, i.e., in a low resistance/conducting state, thereby allowing the input signal to pass from the source to the drain. Similarly, NMOS transistor 116 has its gate connected to an inversion of the enable signal 174. Since the enable signal 172 is low, or zero volts, the inversion signal 174 is high or 1.8 V. For an NMOS transistor, the Vgs must be positive in order to close the gate, i.e., to turn the transistor on and place it in a low resistance/conducting state. In particular, it must be positive and must also be greater in magnitude than the threshold voltage of the transistor. However, for illustrative purposes the latter condition is ignored. In this case, for NMOS transistor 116, the source is 1.2 V, the gate is 1.8 V, thus Vgs=1.8 V−1.2 V=0.6 V. Since this is a positive voltage, the gate is closed and the input signal passes from the source to the drain.

NMOS transistor 112 has its source connected to ground, e.g., zero volts and the gate is connected to the enable signal 172, which in this example is also zero volts. Since Vgs=0, the gate is open and there is very little or no current flow from the source to the drain. In fact, whenever the enable signal 172 is low/zero volts, NMOS transistor 112 is open/off.

Accordingly, since the drains of PMOS transistor 114 and NMOS transistor 116 are connected to the gate of PMOS transistor 110, the gate of PMOS transistor 110 receives the input signal of 1.2 V. The source terminal of PMOS transistor 110 is also 1.2 V, since it is directly connected to the input terminal 152. As such, for PMOS transistor 110, Vgs=1.2 V−1.2 V=0 V. Accordingly, PMOS transistor 110 is off, i.e., the gate is open and is not conducting, or is in a very high resistance state. Consequently, by setting the enable signal 172 low, the gate of PMOS transistor 110 is provided with the input signal. By design, the input signal and the gate are at the same voltage level, Vgs=0. Therefore, PMOS transistor 110 is prevented from passing the input signal from its source terminal to its drain.

For zero volts on the input terminal 152 and a low/zero volts on the enable signal 172, Vgs for PMOS transistor 114 is: Vgs=0 V−0 V=0 V. Thus, PMOS transistor 114 is open/off. For NMOS transistor 116, the source is 0 V, the gate is the inversion of the enable signal 174 (1.8 V), therefore Vgs=1.8 V and the transistor is closed/on. Thus, the input signal of zero volts passes from the source to the drain of NMOS transistor 116 and on to the gate of PMOS transistor 110.

The structure of the circuit 182 works similarly well when there is an overvoltage or an undervoltage on the input terminal 152. In particular, an overvoltage is a voltage that is greater than the supply voltage of the circuit/device. In this example, the supply voltage is 1.8 V. Thus, an overvoltage is anything greater than 1.8 V. An undervoltage is any voltage that is less than the ground voltage for the device/circuit. In this example, any voltage that is less than zero volts, i.e., any negative voltages, are undervoltages.

To illustrate how circuit 182 works when there is an overvoltage, if the enable signal 172 is at zero volts and the input is 1.9 V, for PMOS transistor 114, Vgs=−1.9 V. This is negative, so PMOS transistor 114 is on, passing the input from the source to the drain. For NMOS transistor 116, the gate terminal has the inversion of the enable signal 174 (which is 1.8 V), and the source is 1.9 V. Therefore for NMOS transistor 116, Vgs=−0.1 V. Since this is negative, the transistor is open and not conducting. However, since PMOS transistor 114 is closed and conducting, the input still passes to the gate terminal of PMOS transistor 110. Further, the gate and the source voltages of PMOS transistor 110 are both 1.9 V, resulting in: Vgs=1.9 V−1.9 V=0 V. Thus, PMOS transistor 110 remains off.

For −0.2 V volts on the input terminal 152 and a low/zero volts on the enable signal 172, Vgs for PMOS transistor 114 is: Vgs=0 V−(−0.2 V)=0.2 V. Since this is not a negative voltage, PMOS transistor 114 is open/off. For NMOS transistor 116, the source is −0.2 V, the gate is the inversion of the enable signal 174 (1.8 V), therefore Vgs=1.8 V−(−0.2 V)=2 V. Since this is a positive voltage for an NMOS transistor, NMOS transistor 116 is closed/on. Thus, the input signal of −0.2V passes from the source to the drain of NMOS transistor 116 and on to the gate of PMOS transistor 110.

When the enable signal 172 is on, e.g., a high, or 1.8 V, the circuit 182 acts to deliver a zero volt/ground signal to the gate of PMOS transistor 110 in order to turn it on. In particular, NMOS transistor 112 has its source connected to ground 192, which is zero volts. With the enable signal 172 at 1.8 V, for NMOS transistor 112, Vgs=1.8 V−0 V=1.8 V. Since this is a positive voltage, the transistor is on and passes the signal from the source to the drain; in this case a ground signal of zero volts. This signal further passes from the drain of NMOS transistor 112 to the gate of PMOS transistor 110. Since the gate of PMOS transistor 110 is zero volts, for any input over zero volts, Vgs for PMOS transistor 110 is negative and the transistor is on. Thus, the input will pass from the source to the drain of PMOS transistor 110.

When the enable signal 172 is high/1.8 V, PMOS transistor 114 and NMOS transistor 116 are both open/off. For instance, for PMOS transistor 114, Vgs=1.8 V−N, where N is any expected input voltage. In this case, expected voltages are 0 to 1.7 V, thus Vgs should always be positive and PMOS transistor 114 will remain open/off. In addition, if there is a small overvoltage on the input terminal 152, e.g., 1.9 V, then Vgs=1.8 V−1.9 V=−0.1 V. While a negative voltage is typically required to turn on a PMOS transistor, in practice it must be of sufficient magnitude to overcome the threshold voltage, Vt, of the transistor. Thus, a small overvoltage that does not overcome the threshold voltage Vt will fail to turn on the PMOS transistor 114. Similarly, for NMOS transistor 116, a small undervoltage, e.g., −0.2 V will result in Vgs=0 V−(−0.2 V)=0.2 V. While this is a positive voltage, if it is less than Vt for NMOS transistor 116, then NMOS transistor 116 will remain open/off. Thus, for a small overvoltage or undervoltage PMOS transistor 114 and NMOS transistor 116 do not affect the gate of PMOS transistor 110 and allow the input signal on input terminal 152 to pass to the drain of PMOS transistor 110. As such, if device 100 comprise a portion of a multiplexer/measurement device, it is still possible to measure voltages on input terminal 152 that exceed the supply voltage or ground. On the other hand, where the overvoltage or undervoltage is greater in magnitude than Vt for either of PMOS transistor 114 or NMOS transistor 116, then circuit 182 will isolate the input terminal 152 and provide a measure of protection to the rest of the device.

The foregoing examples have illustrated the functionality of device 100 with respect to circuit 182 and PMOS transistor 110 in PMOS path 162. In particular, examples are shown where the device 100 is deactivated by the enable signal (e.g., the enable signal is zero volts) and the input signal is in a normal range of voltages, e.g., zero to 1.7 V, as well as where the input is an overvoltage or an undervoltage. An additional example is provided where the device 100 is activated by the enable signal, e.g., where the enable signal is high/1.8 V. Notably, circuit 184 and PMOS device 120 provide similar functionality with respect to the output terminal 154 of device 100.

Figure 2:
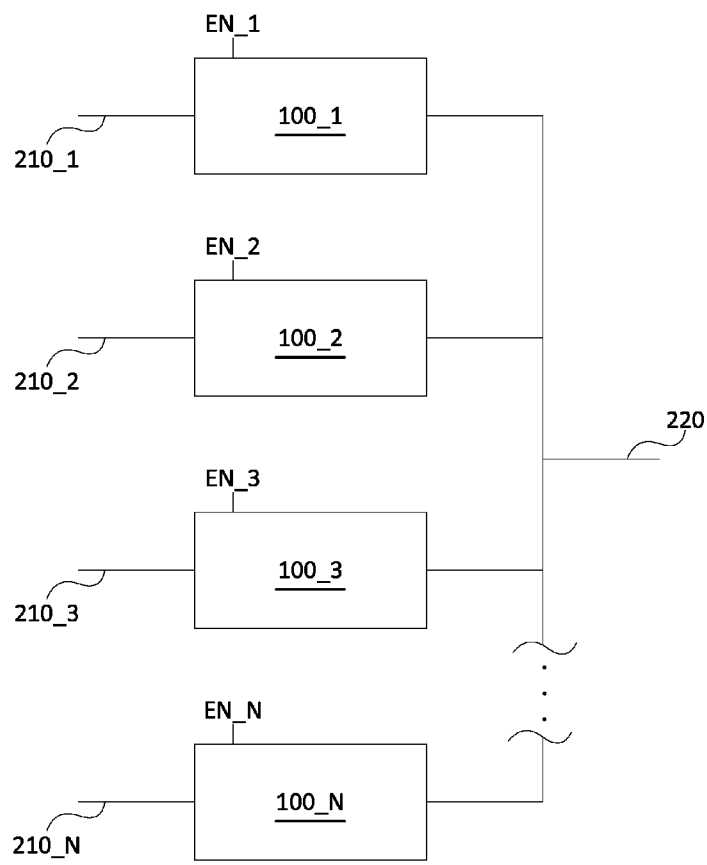
FIG. 2 illustrates a block diagram of a second device.

As described above, the device 100 may comprise one of several paths of a multiplexer where different inputs are tied to a common output. For instance, as mentioned above, such a multiplexer may be used as a sampling circuit for measuring different analog voltage signals from around a larger device, e.g., an integrated circuit. To illustrate, FIG. 2 shows an example device 200, e.g., a multiplexer, comprising a number of paths 210_1 to 210_N that are connected to a common output 220. Each of the paths 210_1 to 210_N includes a respective circuit 100_1 to 100_N for selectively isolating an input from the output 220. For example, each of circuits 100_1 to 100_N may comprise a different circuit in the form of device 100 of FIG. 1. In addition, each of the circuits 100_1 to 100_N may have a different enable signal EN_1 to EN_N for controlling the respective circuits. In general, one of the paths may be activated, or selected, to pass an input to the output 220 and the other paths may be prevented from passing respective inputs to the output 220 using the different enable signals EN_1 to EN_N. For example, path 210_2 may be selected by setting EN_2 to 1.8 V and by setting each of EN_1, EN_3 . . . . EN_N to zero volts. If device 200 is for sampling various voltages for a measurement circuit, the input that is currently being measured, e.g., the input of path 210_2 may be passed to the output 220, while the inputs of each of the other paths are isolated from the output 220.

Returning to a discussion of device 100 of FIG. 1, it is desirable to isolate the input terminal 152 from the output terminal 154 when the device 100 is not enabled and to couple the input terminal 152 to the output terminal 154 when the device 100 is enabled. Accordingly, circuit 182 and PMOS transistor 110 are able to isolate the input terminal 152 from the drain of PMOS transistor 110 when the device 100 is not enabled (e.g., enable signal 172 is low or zero volts). Further, circuit 182 and PMOS transistor 110 are able to pass the input signal from the input terminal 152 to the drain of PMOS transistor 110 when the device 100 is enabled (e.g., enable signal 172 is high or 1.8 V).

In a similar manner, circuit 184 and PMOS transistor 120 are able to isolate the signal on output terminal 154 from the drain of PMOS transistor 120 when the device 100 is not enabled and to remain closed, or turned on when the device 100 is enabled. To illustrate, it is assumed that the output terminal 154 has a signal of 1.2 V and the enable signal 172 is zero volts. For NMOS transistor 122, Vgs=0 V–0 V=0 V. Thus, NMOS transistor 122 is always open/off when the enable signal is low/zero volts. PMOS transistor 124 has a gate voltage of zero volts and a source voltage of 1.2 V. Thus, Vgs=0 V–1.2 V=–1.2 V. Since this is a negative voltage, PMOS transistor 124 is closed and therefore "on" and conducting. Thus, the source and drain are connected and the 1.2 V from the output 154 passes from the source terminal to the drain terminal of PMOS transistor 124. Likewise, NMOS transistor 126 has the inversion of the enable signal 174, 1.8 V on its gate and 1.2 V from the output signal on output terminal 154 on its source. Thus, Vgs=1.8 V–1.2 V=0.6 V. Thus, NMOS transistor 126 is closed/on and the output signal of 1.2 V passes from the source to the drain of NMOS transistor 126 and on to the gate of PMOS transistor 120. Since the gate and source of PMOS transistor 120 are the same, 1.2 V, then Vgs=0 V and PMOS transistor 120 is off. Accordingly, the signal on output terminal 154 is isolated from the drain of PMOS transistor 120.

For zero volts on the output terminal 154 and a low/zero volts on the enable signal 172, Vgs for the PMOS transistor 124 is: Vgs=0 V–0 V=0 V. Thus, PMOS transistor 124 is open/off. For NMOS transistor 126, the source is zero volts and the gate is the inversion of the enable signal 174, which is 1.8 V. Therefore, Vgs=1.8 V–0 V=1.8 V and NMOS transistor 126 is closed/on. Thus, the input signal of zero volts passes from the source to the drain of NMOS transistor 126 and on to the gate of PMOS transistor 120. In addition, for PMOS transistor 120, Vgs=0 V–0 V=0 V and the transistor is open/off.

The structure of circuit 184 works similarly well to isolate the output terminal 154 from the drain of PMOS transistor 120 when the output signal is an overvoltage or an undervoltage. For instance, if the enable signal 172 is at zero volts and the output signal is 1.9 V, for PMOS transistor 124 the gate voltage of zero volts and the source voltage is 1.9 V. Thus, Vgs=0 V–1.9 V=–1.9 V. Since this is a negative voltage, PMOS transistor 124 is closed/on and conducting. Thus, the source and drain are connected and the 1.9 V from the output 154 passes from the source terminal to the drain terminal of PMOS transistor 124. Likewise, NMOS transistor 126 has the inversion of the enable signal 174, 1.8 V on its gate and 1.9 V from the output signal on output terminal 154 on its source. Thus, Vgs=1.8 V–1.9 V=–0.1 V. Thus, NMOS transistor 126 is open/off. However, since PMOS transistor 124 is closed/on, it is able to pass the output signal from its source to its drain and on to the gate of PMOS transistor 120. Since the gate and source of PMOS transistor 120 are the same, 1.9 V, then Vgs=0 V and PMOS transistor 120 is off. Accordingly, the signal on output terminal 154 is isolated from the drain of PMOS transistor 120 even when there is an overvoltage.

For –0.2 V on the output terminal 154 and a low/zero volts on the enable signal 172, Vgs for PMOS transistor 124 is: Vgs=0 V–(–0.2 V)=0.2 V. Since this is not a negative voltage, PMOS transistor 124 is open/off. However, for NMOS transistor 126, the source is –0.2 V, the gate is the inversion of the enable signal 174 (1.8 V), therefore Vgs=1.8 V–(–0.2 V)=2 V. Since this is a positive voltage for an NMOS transistor, NMOS transistor 126 is closed/on. Thus, the output signal of –2.V passes from the source to the drain of NMOS transistor 126 and on to the gate of PMOS transistor 120.

When the enable signal 172 is on, e.g., a high, or 1.8 V, the circuit 184 acts to deliver a zero volt/ground signal to the gate of PMOS transistor 120 in order to turn it on. In particular, NMOS transistor 122 has its source connected to ground 192, which is zero volts. With the enable signal 172 at 1.8 V, for NMOS transistor 122, Vgs=1.8 V–0 V=1.8 V. Since this is a positive voltage, the transistor is on and passes the signal from the source to the drain; in this case a ground signal of zero volts. This signal further passes from the drain of NMOS transistor 122 to the gate of PMOS transistor 120. Since the gate of PMOS transistor 120 is zero volts, for any input over zero volts, Vgs for PMOS transistor 120 is negative and the transistor is on. Thus, the source and drain of PMOS transistor 120 will be connected.

When the enable signal 172 is high/1.8 V, PMOS transistor 124 and NMOS transistor 126 are both open/off. For instance, for PMOS transistor 124, Vgs=1.8 V−N, where N is any expected voltage on the output terminal 154. In this case, expected voltages are 0 to 1.7 V, thus Vgs should always be positive and PMOS transistor 124 will remain open/off. In addition, if there is a small overvoltage on the input terminal 152 that passes to the output terminal 154, e.g., 1.9 V, then Vgs=1.8 V−1.9 V=−0.1 V. While a negative voltage is typically required to turn on a PMOS transistor, in practice it must be of sufficient magnitude to overcome the threshold voltage, Vt of the transistor. Thus, a small overvoltage that does not overcome the threshold voltage Vt will fail to turn on the PMOS transistor 124. Similarly, for NMOS transistor 126, a small undervoltage, e.g., −0.2 V will result in Vgs=0 V−(−0.2 V)=0.2 V. While this is a positive voltage, if it is less than Vt for NMOS transistor 126, then NMOS transistor 126 will remain open/off. Thus, for a small overvoltage or undervoltage PMOS transistor 124 and NMOS transistor 126 do not affect the gate of PMOS transistor 120 and allow the drain and source of PMOS transistor 120 to remain connected. On the other hand, where the overvoltage or undervoltage is greater in magnitude than Vt for either of PMOS transistor 124 or NMOS transistor 126, then circuit 184 will isolate the source and drain of PMOS transistor 120 and provide a measure of protection to the rest of the device.

The foregoing description relates to the PMOS path 162. NMOS path 164 includes similar components, the functions of which are described below. In particular, NMOS path 164 includes NMOS transistor 130 which has its source terminal connected to the input terminal 152 of device 100. The NMOS path 164 also includes PMOS transistor 132, NMOS transistor 134 and PMOS transistor 136. Collectively, the transistors 132, 134 and 136 may comprise a circuit 186 that delivers a signal on the input terminal 152 to the gate of the NMOS transistor 130 when the enable signal 172 is low, e.g., zero volts, and that delivers a ground signal 192 when the enable signal 172 is high, e.g., 1.8 V.

To illustrate, if the enable signal is zero volts and the input signal is 1.2 V, the input signal of 1.2 V will be present at the source terminals of NMOS transistor 134 and PMOS transistor 136. The gate of NMOS transistor 134 is connected to the inversion of the enable signal 174. Since the enable signal 172 is low, or zero volts, the inversion signal 174 is high or 1.8 V. Thus, for NMOS transistor 134, Vgs=1.8 V−1.2 V=0.6 V. Since this is positive, the gate is closed, i.e., in a low resistance/conducting state, thereby allowing the input signal to pass from the source to the drain. Similarly, for PMOS transistor 136 the source is 1.2 V and the gate is connected to enable signal 172, e.g., zero volts. Thus Vgs=0 V−1.2 V=−1.2 V. Since this is a negative voltage, the gate is closed and the input signal passes from the source to the drain.

PMOS transistor 132 has its source connected to supply voltage 132, e.g., 1.8 volts and the gate is connected to the inversion of the enable signal 174, which in this example is also 1.8 V. Since Vgs=0, the gate is open and there is very little or no current flow from the source to the drain. Thus, whenever the inversion of the enable signal 174 is high/1.8 V, PMOS transistor 132 is open/off.

Accordingly, since the drains of NMOS transistor 134 and PMOS transistor 136 are connected to the gate of NMOS transistor 130, the gate of NMOS transistor 130 receives the input signal of 1.2 V. The source terminal of NMOS transistor 130 is also 1.2 V, since it is directly connected to the input terminal 152. As such, for NMOS transistor 130, Vgs=1.2 V−1.2 V=0 V. Accordingly, NMOS transistor 130 is off, i.e., the gate is open and is not conducting, or is in a very high resistance state. By design, the input signal and the gate are at the same voltage level, Vgs=0. Therefore, PMOS transistor 110 is prevented from passing the input signal from its source terminal to its drain.

For zero volts on the input terminal 152 and a low/zero volts on the enable signal 172 (high/1.8 V on the inversion of the enable signal 174), Vgs for NMOS transistor 134 is: Vgs=1.8 V−0 V=1.8 V. Thus, NMOS transistor 134 is closed/on and the input signal of zero volts passes from the source to the drain of NMOS transistor 134 and on to the gate of NMOS transistor 130. For PMOS transistor 136, the source is 0 V, the gate is the inversion of the enable signal 174 (0 V), therefore Vgs=0 V and the transistor is off.

The structure of the circuit 186 works similarly well when there is an overvoltage or an undervoltage on the input terminal 152. For example, if the enable signal 172 is at zero volts, the inversion of the enable signal 174 is high/1.8 V and the input is 1.9 V. For NMOS transistor 134, Vgs=1.8 V−1.9 V=−0.1 V. This is negative, so NMOS transistor 134 is open/off. However, for PMOS transistor 136, the gate terminal has the enable signal 172 (which is 0 V), and the source is 1.9 V. Therefore for PMOS transistor 136, Vgs=0 V−1.9 V=−1.9 V. Since this is negative, the transistor is closed/on and conducting. Thus, the input signal passes from the source to the drain of PMOS transistor 136 and on to the gate terminal of NMOS transistor 130. Further, the gate and the source voltages of NMOS transistor 130 are both 1.9 V, resulting in: Vgs=1.9 V−1.9 V=0 V. Thus, NMOS transistor 130 remains off.

For −0.2 V volts on the input terminal 152 and a low/zero volts on the enable signal 172 (inversion of the enable signal 174 is high/1.8 V), Vgs for NMOS transistor 134 is: Vgs=1.8 V−(−0.2 V)=2 V. Since this is not a positive voltage, NMOS transistor 134 is closed/on. Thus, the input signal of −0.2V passes from the source to the drain of NMOS transistor 136 and on to the gate of NMOS transistor 130. For PMOS transistor 136, the source is −0.2 V, the gate is the enable signal 172 (zero volts), therefore Vgs=0 V−(−0.2 V)=0.2 V. Since this is a positive voltage for an PMOS transistor, PMOS transistor 136 is open/off.

When the enable signal 172 is on and the inversion of the enable signal 174 is low/zero volts, the circuit 186 acts to deliver a supply voltage signal to the gate of NMOS transistor 130 in order to turn it on. In particular, PMOS transistor 132 has its source connected to supply 194, which in the present example is given as 1.8 V. With the inversion of the enable signal 174 at zero volts, for PMOS transistor 132, Vgs=0 V−1.8 V=−1.8 V. Since this is a negative voltage, the transistor is on and passes the signal from the source to the drain; in this case a supply signal of 1.8 V. This signal further passes from the drain of PMOS transistor 132 to the gate of NMOS transistor 130. Since the gate of NMOS transistor 130 is 1.8 V, for any expected input (e.g., zero to 1.7 V), Vgs for NMOS transistor 130 is positive and the transistor is on. Thus, the input will pass from the source to the drain of NMOS transistor 130.

When the enable signal 172 is high, the inversion of the enable signal 174 is low, and NMOS transistor 134 and PMOS transistor 136 are both open/off. For instance, for NMOS transistor 134, Vgs=0 V−N, where N is any expected input voltage. In this case, expected voltages are 0 to 1.7 V, thus Vgs should always be zero or negative and NMOS transistor 134 will remain open/off. In addition, if there is a small undervoltage on the input terminal 152, e.g., −0.2 V, then Vgs=0 V−(−0.2 V)=0.2 V. While a positive voltage is typically required to turn on an NMOS transistor, in practice it must be of sufficient magnitude to overcome the threshold voltage, Vt of the transistor. Thus, a small overvoltage that does not overcome the threshold voltage Vt will fail to turn on the NMOS transistor 134. Similarly, for PMOS transistor 136, a small overvoltage, e.g., 1.9 V will result in Vgs=1.8 V−(1.9 V)=−0.1 V. While this is a negative voltage, if it is of insufficient magnitude to overcome Vt for PMOS transistor 136, then PMOS transistor 136 will remain open/off. Thus, for a small overvoltage or undervoltage NMOS transistor 134 and PMOS transistor 136 do not affect the gate of NMOS transistor 130 and allow the input signal on input terminal 152 to pass to the drain of NMOS transistor 130. On the other hand, where the overvoltage or undervoltage is greater in magnitude than Vt for either of NMOS transistor 134 or PMOS transistor 136, then circuit 186 will isolate the input terminal 152 and provide a measure of protection to the rest of the device.

Accordingly, circuit 186 and NMOS transistor 130 are able to isolate the input terminal 152 from the drain of NMOS transistor 130 when the device 100 is not enabled (e.g., enable signal 172 is low or zero volts and inversion of the enable signal 174 is high/1.8 V). Further, circuit 186 and NMOS transistor 130 are able to pass the input signal from the input terminal 152 to the drain of NMOS transistor 130 when the device 100 is enabled (e.g., enable signal 172 is high or 1.8 V and the inversion of the enable signal 174 is low/zero volts). In a similar manner, circuit 188 and NMOS transistor 140 are able to isolate the signal on output terminal 154 from the drain of NMOS transistor 140 when the device 100 is not enabled and to remain closed, or turned on when the device 100 is enabled.

To illustrate, it is assumed that the output terminal 154 has a signal of 1.2 V and the enable signal 172 is zero volts (i.e., the inversion of the enable signal 174 is high/1.8 V). For PMOS transistor 142, the source is connected to supply 188, e.g., 1.8 V. Thus, Vgs=1.8 V−1.8 V=0 V. Thus, PMOS transistor 142 is always open/off when the enable signal is low/zero volts (i.e., when the inversion of the enable signal 174 is high/1.8 V). NMOS transistor 144 has a gate voltage of 1.8 volts and a source voltage of 1.2 V. Thus, Vgs=1.8 V−1.2 V=0.6 V. Since this is a positive voltage, NMOS transistor 144 is closed and therefore "on" and conducting. Thus, the source and drain are connected and the 1.2 V from the output 154 passes from the source terminal to the drain terminal of NMOS transistor 144. Likewise, PMOS transistor 146 has the enable signal 172, zero volts, on its gate and 1.2 V from the output signal on output terminal 154 on its source. Thus, Vgs=0 V−1.2 V=−1.2 V. Thus, PMOS transistor 146 is closed/on and the output signal of 1.2 V passes from the source to the drain of PMOS transistor 146 and on to the gate of NMOS transistor 140. Since the gate and source of NMOS transistor 140 are the same, 1.2 V, then Vgs=0 V and NMOS transistor 140 is off. Accordingly, the signal on output terminal 154 is isolated from the drain of NMOS transistor 140.

For zero volts on the output terminal 154 and a low/zero volts on the enable signal 172 (inversion of the enable signal 174 is high/1.8 V), Vgs for the NMOS transistor 144 is: Vgs=1.8 V−0 V=1.8 V. Thus, NMOS transistor 144 is closed/on. Thus, the input signal of zero volts passes from the source to the drain of NMOS transistor 144 and on to the gate of NMOS transistor 140. For PMOS transistor 146, the source is zero volts and the gate is the enable signal 172, which is 0 V. Therefore, Vgs=0 V−0 V=0 V and PMOS transistor 126 is open.off. In addition, for NMOS transistor 140, Vgs=0 V−0 V=0 V and the transistor is open/off.

The structure of circuit 188 works similarly well to isolate the output terminal 154 from the drain of NMOS transistor 140 when the output signal is an overvoltage or an undervoltage. For instance, if the enable signal 172 is at zero volts (inversion of the enable signal 174 is high/1.8 V) and the output signal is 1.9 V, for NMOS transistor 144 the gate voltage of 1.8 V volts and the source voltage is 1.9 V. Thus, Vgs=1.8 V−1.9 V=−0.1 V. Since this is a negative voltage, NMOS transistor 124 is open/off. On the other hand, PMOS transistor 146 has the enable signal 172, zero volts on its gate and 1.9 V from the output signal on output terminal 154 on its source. Thus, Vgs=0 V−1.9 V=−1.9 V. Thus, PMOS transistor 146 is closed/on and conducting. As such, the source and drain are connected and the 1.9 V from the output 154 passes from the source terminal to the drain terminal of PMOS transistor 146 and on to the gate of NMOS transistor 140. Since the gate and source of NMOS transistor 140 are the same, 1.9 V, then Vgs=0 V and NMOS transistor 140 is off. Accordingly, the signal on output terminal 154 is isolated from the drain of NMOS transistor 140 even when there is an overvoltage.

For −0.2 V on the output terminal 154 and a low/zero volts on the enable signal 172 (high/1.8 V on the inversion of the enable signal 174), Vgs for NMOS transistor 144 is: Vgs=1.8 V−(−0.2 V)=2 V. Since this is a positive voltage, NMOS transistor 144 is closed/on and conducting. Thus, the output signal of −2.V passes from the source to the drain of NMOS transistor 144 and on to the gate of NMOS transistor 140. For PMOS transistor 146, the source is −0.2 V, the gate is the enable signal 172 (zero volts), therefore Vgs=0 V−(−0.2 V)=0.2 V. Since this is a positive voltage for a PMOS transistor, PMOS transistor 136 is open/off. However, since NMOS transistor 144 is closed and conducting, the input still passes to the gate terminal of NMOS transistor 140. Further, the gate and the source voltages of NMOS transistor 140 are both −0.2 V, resulting in: Vgs=−0.2 V−(−0.2 V)=0 V. Thus, NMOS transistor 140 remains off.

When the enable signal 172 is on and the inversion of the enable signal is low/zero volts, the circuit 188 acts to deliver a supply voltage/high signal, e.g., 1.8 V, to the gate of NMOS transistor 140 in order to turn it on. In particular, PMOS transistor 142 has its source connected to a voltage supply 194, which in this example is 1.8 V. With the enable signal 172 low and the inversion of the enable signal high/1.8 V, for PMOS transistor 142, Vgs=0 V−1.8 V=−1.8 V. Since this is a negative voltage, the transistor is on and passes the signal from the source to the drain; in this case a supply signal of 1.8 V. This signal further passes from the drain of PMOS transistor 142 to the gate of NMOS transistor 140. Since the gate of NMOS transistor 140 is 1.8 V, for any expected input, e.g., zero to 1.7 V, Vgs for NMOS transistor 140 is positive and the transistor is on. Thus, the source and drain of NMOS transistor 140 will be connected.

When the enable signal 172 is high and the inversion of the enable signal 174 is low/zero volts, NMOS transistor 144 and PMOS transistor 146 are both open/off. For instance, for NMOS transistor 144, Vgs=0 V−N, where N is any expected voltage on the output terminal 154. In this case, expected voltages are 0 to 1.7 V, thus Vgs should always be zero or negative and NMOS transistor 144 will remain open/off. In addition, if there is a small undervoltage on the input terminal 152 that passes to the output terminal 154, e.g., −0.2 V, then Vgs=0 V−(−0.2 V)=0.2 V. While a positive voltage is typically required to turn on a NMOS transistor, in practice it must be of sufficient magnitude to overcome the threshold voltage, Vt of the transistor. Thus, a small undervoltage that does not overcome the threshold voltage Vt will fail to turn on the NMOS transistor 144. Similarly, for PMOS transistor 146, a small overvoltage, e.g., 1.9 V will result in Vgs=1.8 V−1.9V=−0.1 V. While this is a negative voltage, if it is of less magnitude than Vt for PMOS transistor 136, then PMOS transistor 136 will remain open/off. Thus, for a small overvoltage or undervoltage NMOS transistor 144 and PMOS transistor 146 do not affect the gate of NMOS transistor 140 and allow the drain and source of NMOS transistor 140 to remain connected. On the other hand, where the overvoltage or undervoltage is greater in magnitude than Vt for either of NMOS transistor 134 or PMOS transistor 146, then circuit 188 will isolate the source and drain of NMOS transistor 140 and provide a measure of protection to the rest of the device.

As described herein device 100 is able to isolate the input terminal 152 from the output terminal 154 through a range of expected voltages as well as in circumstances where there is an overvoltage or an undervoltage on the input terminal 152 and/or the output terminal 154. In addition, device 100 allows all expected input voltages as well as some overvoltages and some undervoltages to pass from the input terminal 152 to the output terminal 154 when the enable signal is high, i.e., when the device 100 is activated. Thus, in a multiplexer/measurement circuit where device 100 may comprise one of many paths, it is possible to measure voltages on the input terminal 152 that exceed supply and/or ground while protecting the device 100 as well as any other components connected thereto from voltages with greater deviation.

While the foregoing describes various examples in accordance with one or more aspects of the present disclosure, other and further example(s) in accordance with the one or more aspects of the present disclosure may be devised without departing from the scope thereof, which is determined by the claim(s) that follow and equivalents thereof. For instance, in one example, PMOS transistors 116 and 126, and NMOS transistors 136 and 172 may be omitted while the device 100 retains most or all desired functionality as described above. Claim(s) listing steps do not imply any order of the steps. Trademarks are the property of their respective owners.

What is claimed is:

1. A device, comprising:
   a first p-type metal oxide semiconductor transistor, wherein a source of the first p-type metal oxide semiconductor transistor is connected to an input of the device; and
   a first circuit, for delivering a signal on the input of the device to a gate of the first p-type metal oxide semiconductor transistor when an enable signal is deactivated and for delivering a ground voltage to the gate of the first p-type metal oxide semiconductor transistor when the enable signal is activated, wherein the first circuit comprises:
      a second p-type metal oxide semiconductor transistor, wherein a source of the second p-type metal oxide semiconductor transistor is connected to the input of the device and wherein a gate of the second p-type metal oxide semiconductor transistor is connected to the enable signal;
      a first n-type metal oxide semiconductor transistor, wherein a source of the first n-type metal oxide semiconductor transistor is connected to ground, wherein a drain of the first n-type metal oxide semiconductor transistor is connected to a drain of the second p-type metal oxide semiconductor transistor, wherein a gate of the first n-type metal oxide semiconductor transistor is connected to the enable signal; and
      a second n-type metal oxide semiconductor transistor, wherein a gate of the second n-type metal oxide semiconductor transistor is connected to an inversion of the enable signal, wherein a source of the second n-type metal oxide semiconductor transistor is connected to the input of the device, and wherein the drain of the second p-type metal oxide semiconductor transistor, the drain of the first n-type metal oxide semiconductor transistor, and a drain of the second n-type metal oxide semiconductor transistor are connected to the gate of the first p-type metal oxide semiconductor transistor.

2. The device of claim 1, wherein the source of the first p-type metal oxide semiconductor transistor is shorted to a bulk of the first p-type metal oxide semiconductor transistor.

3. The device of claim 1, wherein the inversion of the enable signal and ground are a same voltage.

4. The device of claim 1, further comprising:
   a third p-type metal oxide semiconductor transistor, wherein a source of the third p-type metal oxide semiconductor transistor is connected to an output of the device, and wherein a drain of the third p-type metal oxide semiconductor transistor is connected to a drain of the first p-type metal oxide semiconductor transistor; and
   a second circuit, for delivering a signal on the output of the device to a gate of the third p-type metal oxide semiconductor transistor when the enable signal is deactivated and for delivering the ground voltage to a gate of the third p-type metal oxide semiconductor transistor when the enable signal is activated.

5. The device of claim 4, wherein the second circuit comprises:
   a fourth p-type metal oxide semiconductor transistor, wherein a source of the fourth p-type metal oxide semiconductor transistor is connected to the output of the device and wherein a gate of the fourth p-type metal oxide semiconductor transistor is connected to the enable signal;
   a third n-type metal oxide semiconductor transistor, wherein a source of the third n-type metal oxide semiconductor transistor is connected to ground and wherein a gate of the third n-type metal oxide semiconductor transistor is connected to the enable signal; and
   a fourth n-type metal oxide semiconductor transistor, wherein a gate of the fourth n-type metal oxide semiconductor transistor is connected to an inversion of the enable signal, wherein a source of the fourth n-type metal oxide semiconductor transistor is connected to the output of the device, and wherein a drain of the fourth p-type metal oxide semiconductor transistor, a drain of the third n-type metal oxide semiconductor transistor, and a drain of the fourth n-type metal oxide semiconductor transistor are connected to the gate of the third p-type metal oxide semiconductor transistor.

6. The device of claim 1, further comprising:
   a fifth n-type metal oxide semiconductor transistor, wherein a source of the fifth n-type metal oxide semiconductor transistor is connected to the input of the device; and
   a third circuit, for delivering a signal on the input of the device to a gate of the fifth n-type metal oxide semiconductor transistor when the enable signal is deactivated and for delivering a supply voltage to the gate of the fifth n-type metal oxide semiconductor transistor when the enable signal is activated.

7. The device of claim 6, wherein the enable signal is a same voltage as the supply voltage.

8. The device of claim 6, wherein the input of the device comprises an analog signal having a voltage between a voltage level of ground and a voltage level of the supply voltage.

9. The device of claim 6, wherein the third circuit comprises:
   a sixth n-type metal oxide semiconductor transistor, wherein a source of the sixth n-type metal oxide semiconductor transistor is connected to the input of the device and wherein a gate of the sixth n-type metal oxide semiconductor transistor is connected to the inversion of the enable signal;
   a fifth p-type metal oxide semiconductor transistor, wherein a source of the fifth p-type metal oxide semiconductor transistor is connected to the supply voltage and wherein a gate of the fifth p-type metal oxide semiconductor transistor is connected to an inversion of the enable signal; and
   a sixth p-type metal oxide semiconductor transistor, wherein a source of the sixth p-type metal oxide semiconductor transistor is connected to the input signal, wherein a gate of the sixth p-type metal oxide semiconductor transistor is connected to the enable signal, and wherein a drain of the sixth n-type metal oxide semiconductor transistor, a drain of the fifth p-type metal oxide semiconductor transistor and a drain of the sixth p-type metal oxide semiconductor transistor are connected to a gate of the fifth n-type metal oxide semiconductor transistor.

10. The device of claim 6, further comprising:
    a seventh n-type metal oxide semiconductor transistor, wherein a source of the seventh n-type metal oxide semiconductor transistor is connected to an output of the device and wherein a drain of the seventh n-type metal oxide semiconductor transistor is connected to a drain of the fifth n-type metal oxide semiconductor transistor; and
    a fourth circuit, for delivering a signal on the output of the device to a gate of the seventh n-type metal oxide semiconductor transistor when the enable signal is deactivated and for delivering a supply voltage to the gate of the seventh n-type metal oxide semiconductor transistor when the enable signal is activated.

11. The device of claim 10, wherein the fourth circuit comprises:
    a seventh p-type metal oxide semiconductor transistor, wherein a source of the seventh p-type metal oxide semiconductor transistor is connected to the supply voltage and wherein a gate of the seventh p-type metal oxide semiconductor transistor is connected to the inversion of the enable signal;
    an eighth n-type metal oxide semiconductor transistor, wherein a source of the eighth n-type metal oxide semiconductor transistor is connected to the output of the device and wherein a gate of the eighth n-type metal oxide semiconductor transistor is connected to the inversion of the enable signal; and
    an eighth p-type metal oxide semiconductor transistor, wherein a source of the eighth p-type metal oxide semiconductor transistor is connected to the output of the device, wherein a gate of the eighth p-type metal oxide semiconductor transistor is connected to the enable signal, wherein a drain of the seventh p-type metal oxide semiconductor transistor, a drain of the eighth p-type metal oxide semiconductor transistor and a drain of the eighth n-type metal oxide semiconductor transistor are connected to a gate of the seventh n-type metal oxide semiconductor transistor.

12. The device of claim 10, further comprising:
    a third p-type metal oxide semiconductor transistor, wherein a source of the third p-type metal oxide semiconductor transistor is connected to an output of the device, and wherein a drain of the third p-type metal oxide semiconductor transistor is connected to a drain of the first p-type metal oxide semiconductor transistor; and
    a second circuit, for delivering the signal on the output of the device to a gate of the third p-type metal oxide semiconductor transistor when the enable signal is deactivated and for delivering the ground voltage to a gate of the third p-type metal oxide semiconductor transistor when the enable signal is activated.

* * * * *